(12) United States Patent
Zeng

(10) Patent No.: US 10,797,271 B2
(45) Date of Patent: Oct. 6, 2020

(54) MANUFACTURING METHOD FOR OLED DISPLAY PANEL

(71) Applicant: Shenzhen China Star Optoelectronics Technology Co., Ltd., Shenzhen (CN)

(72) Inventor: Weijing Zeng, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 0 days.

(21) Appl. No.: 16/656,576

(22) Filed: Oct. 18, 2019

(65) Prior Publication Data

US 2020/0052250 A1     Feb. 13, 2020

Related U.S. Application Data

(62) Division of application No. 15/505,106, filed on Feb. 20, 2017, now Pat. No. 10,505,153.

(30) Foreign Application Priority Data

Oct. 19, 2016    (CN) .......................... 2016 1 0912009

(51) Int. Cl.
    *H01L 51/56*       (2006.01)
    *H01L 51/52*       (2006.01)

(52) U.S. Cl.
    CPC .......... *H01L 51/56* (2013.01); *H01L 51/5237* (2013.01); *H01L 2227/323* (2013.01); *H01L 2251/566* (2013.01)

(58) Field of Classification Search
CPC ................ H01L 51/56; H01L 51/5237; H01L 2227/323; H01L 2251/566; H01L 27/3244
USPC ................................ 438/26; 257/40, 59, 706
See application file for complete search history.

(56) References Cited

U.S. PATENT DOCUMENTS

| | | | |
|---|---|---|---|
| 6,930,364 B2* | 8/2005 | Bruner | B81C 1/00246 257/414 |
| 8,174,832 B2* | 5/2012 | Yu | H01L 33/483 361/709 |
| 8,980,696 B2* | 3/2015 | Meng | H01L 23/5389 438/110 |

(Continued)

*Primary Examiner* — Bo Fan
(74) *Attorney, Agent, or Firm* — Leong C. Lei

(57) ABSTRACT

A manufacturing method for OLED display panel is disclosed, which first performs patterning on the encapsulation colloid of the encapsulant to divide encapsulation colloid into a plurality of target encapsulation areas, with each target encapsulation area corresponding to each OLED substrate unit, and a gap area outside of target encapsulation areas, performing disintegration treatment from the other side of encapsulation colloid on a portion of encapsulation colloid belonging to gap area so that the surface losing adhesiveness, then attaches encapsulation colloid to OLED substrate, and finally, obtains a plurality of OLED display panels by cutting. This method is simple to perform, reduces the size compatibility requirement of the laminator and avoids the use of extra manipulator and carrier fixture, which reduces the product cost incurred by fixture cleaning, transport, storage and other complex operations, and improves the product of the alignment accuracy, is good for automated production.

4 Claims, 11 Drawing Sheets

(56) References Cited

U.S. PATENT DOCUMENTS

2015/0072454 A1* 3/2015 Kim .................. H01L 27/1266
438/28
2015/0280170 A1* 10/2015 Harikrishna Mohan ....................
H01L 51/5225
257/40

* cited by examiner

MANUFACTURING METHOD FOR OLED DISPLAY PANEL

CROSS REFERENCE TO RELATED APPLICATION

This is a divisional application of co-pending U.S. patent application Ser. No. 15/505,106, filed on Feb. 20, 2017, which is a national stage of PCT Application No. PCT/CN2016/110908, filed on Dec. 20, 2016, claiming foreign priority of Chinese Patent Application No. 201610912009.9, filed on Oct. 19, 2016.

BACKGROUND OF THE INVENTION

1. Field of the Invention

The present invention relates to the field of display techniques, and in particular to a manufacturing method for OLED display panel.

2. The Related Arts

The organic light-emitting diode (OLED) displays are widely used because of the advantages of self-luminous, high brightness, wide viewing angle, high contrast, flexibility and low power consumption, and has gradually begun to replace the traditional liquid crystal display (LCD) in mobile phone screens, computer monitors, full-color television, and so on as a new display technology. OLED display technology and traditional LCD display are different in that no backlight is necessary, and a very thin coating of organic materials and glass substrate are used. When a current flowing through, the organic materials will emit light. However, since the organic material is liable to react with water and oxygen, a small amount of water vapor and oxygen can damage the organic light-emitting material and deteriorate the light-emitting performance of the device. Therefore, the issues of how to prevent the water vapor and oxygen from penetrating the device encapsulation material, and how to eliminate the water vapor and oxygen from inside the device are important to the organic electroluminescent device packaging technology. In order to realize the commercialization of OLED display panel, the related packaging technology has become a research hotspot.

At present, the OLED packaging technologies commonly used comprise: ultraviolet (UV) curing box encapsulation, glass powder laser sealing, face seal, dam and fill encapsulation, thin film packaging, and so on. Among these, the face seal technology is commonly used in large-size OLED display panel. In order to save the product cost, a plurality of panels of required size is usually formed on a high-generation glass substrate to form a number of required size panel. When using face seal, the patterning of encapsulation glue material becomes an issue to be addressed. Referring to FIGS. 1-6, a manufacturing method of OLED display panel using face seal technology comprises the steps of:

Step 10: providing an OLED substrate 100, a plurality of cover plates 210, an a plurality of encapsulants 310; the OLED substrate 100 comprising a plurality of OLED substrate units 110 arranged in an array, and each encapsulants 310 comprising an encapsulation colloid 311 and two release films 312 respectively affixed to opposite sides of the package colloid 311, wherein each cover plate 210 and each of the encapsulants 310 corresponding to a single OLED substrate unit 110 on the OLED substrate 100.

Step 20: as shown in FIG. 1, removing the release film 312 on one side of each of the encapsulation colloid 311.

Step 30: as shown in FIG. 2, using a laminator on the side of each encapsulation colloid to laminate one cover plate 210 to corresponding encapsulation colloid 311 so as to laminate the plurality of encapsulants 310 and the plurality of cover plates 210 correspondingly.

Step 40: as shown in FIG. 3, using a manipulator to place the plurality of laminated encapsulants 310 and cover plates 210 one-by-one on a carrier fixture 500, wherein the position of each of the plurality of laminated encapsulants 310 and cover plates 210 on the carrier fixture 500 corresponding to the position of each of the plurality of OLED substrate units 110 on the OLED substrate 100. At this point, this step requires a higher degree of the flatness of the carrier fixture 500, the control precision of the manipulator, and the position accuracy of the laminated encapsulants 310 and cover plates 210 on the carrier fixture 500.

Step 50: as shown in FIG. 4, removing the release film 312 on the other side of each of the encapsulation colloid 311.

Step 60: as shown in FIG. 5, carried by the carrier fixture 500, the plurality of encapsulation colloids 311 being bonded to the OLED substrate 100 from the other side. At this point, each of the plurality of encapsulation colloids 311 is electrically connected to each of the plurality of OLED substrate units 110 on the OLED substrate 100 corresponding.

Step 70: as shown in FIG. 6, removing the carrier fixture 500, for each of the plurality of OLED substrate units 110, dicing the OLED substrate 100 bonded to the plurality of encapsulation colloids 311 into a plurality of target product, i.e., the OLED display panel.

In actual production, the size of each cover plate 210 and each encapsulant 310 must match the size of target product, which is a production accommodating different sizes of products. In Step 30, the laminator must be able to accommodate laminating encapsulants 300 of different sizes.

Moreover, in known technology, the carrier fixture 500 is used to carry a plurality of laminated encapsulants 310 and cover plates 210. The use carrier fixture 500 requires additional transport, cleaning, storage and operation, which all add up to the production cost and complicate the manufacturing process, as well as lowering the alignment precision when bonding the cover plates 210 and the OLED substrate units 110.

SUMMARY OF THE INVENTION

The object of the present invention is to provide a manufacturing method for OLED display panel, to reduce the equipment cost and process difficulty, to achieve easy process and automatic product.

To achieve the above object, the present invention provides a manufacturing method for OLED display panel, which comprises:

providing an OLED substrate, a cover plate and an encapsulant, wherein the OLED substrate comprising a plurality of OLED substrate units arranged in an array, the encapsulant comprising an encapsulation colloid and two release films adhered respectively to two opposite sides of the encapsulation colloid;

patterning the encapsulation colloid of the encapsulant, wherein specifically, dividing the encapsulation colloid into a plurality of target encapsulation areas, with each target encapsulation area corresponding to each of the plurality of OLED substrate units, and a gap area outside of the target encapsulation areas, performing disintegration treatment on a portion of the encapsulation colloid belonging to the gap area so that the surface of the portion losing adhesiveness.

According to a preferred embodiment of the present invention, optionally, the manufacturing method for OLED display panel specifically comprises the following steps of:

Step 1: providing an OLED substrate, a cover plate and an encapsulant;

Step 2: removing the release film from one side of the encapsulation colloid;

Step 3: attaching the entirety of the cover plate to the encapsulation colloid at the side with the release film removed;

Step 4: removing the release film from the other side of the encapsulation colloid;

Step 5: patterning the encapsulation colloid of the encapsulant, dividing the encapsulation colloid into a plurality of target encapsulation areas, with each target encapsulation area corresponding to each of the plurality of OLED substrate units, and a gap area outside of the target encapsulation areas, performing disintegration treatment from the other side of the encapsulation colloid on a portion of the encapsulation colloid belonging to the gap area so that the surface of the portion losing adhesiveness;

Step 6: attaching the other side of the encapsulation colloid to the OLED substrate;

Step 7: for each of the plurality of OLED substrate units, cutting the OLED substrate and cover plate bonded to the encapsulation colloid to obtain a plurality of OLED display panels.

According to a preferred embodiment of the present invention, optionally, the manufacturing method for OLED display panel specifically comprises the following steps of:

Step 1': providing an OLED substrate, a cover plate and an encapsulant;

Step 2': removing the release film from one side of the encapsulation colloid;

Step 3': patterning the encapsulation colloid of the encapsulant, dividing the encapsulation colloid into a plurality of target encapsulation areas, with each target encapsulation area corresponding to each of the plurality of OLED substrate units, and a gap area outside of the target encapsulation areas, performing disintegration treatment from the side with the release film removed on a portion of the encapsulation colloid belonging to the gap area so that the surface of the portion losing adhesiveness;

Step 4': attaching the entirety of the cover plate to the encapsulation colloid at the side with the release film removed;

Step 5': removing the release film from the other side of the encapsulation colloid;

Step 6': attaching the other side of the encapsulation colloid to the OLED substrate;

Step 7': for each of the plurality of OLED substrate units, cutting the OLED substrate and cover plate bonded to the encapsulation colloid to obtain a plurality of OLED display panels.

According to a preferred embodiment of the present invention, in the step of patterning the encapsulation colloid of the encapsulant, a particle beam bombardment process is used to perform disintegration treatment on the surface of the gap area portion of the encapsulation colloid so that the surface of the portion loses adhesiveness.

According to a preferred embodiment of the present invention, in the step of patterning the encapsulation colloid of the encapsulant, a UV irradiation process is used to perform disintegration treatment on the surface of the gap area portion of the encapsulation colloid so that the surface of the portion loses adhesiveness.

According to a preferred embodiment of the present invention, a laser scan process is used to define the target encapsulation areas on the encapsulation colloid, and the encapsulation colloid is cut off between the target encapsulation areas and the gap area.

According to a preferred embodiment of the present invention, in Step 3, a laminator is used to perform the attachment of the encapsulation colloid to the cover plate.

According to a preferred embodiment of the present invention, in Step 6: the attachment of the encapsulation colloid to the OLED substrate is performed in a vacuum environment.

According to a preferred embodiment of the present invention, in Step 4', a laminator is used to perform the attachment of the encapsulation colloid to the cover plate.

According to a preferred embodiment of the present invention, in Step 6': the attachment of the encapsulation colloid to the OLED substrate is performed in a vacuum environment.

Another embodiment of the present invention provides a manufacturing method for OLED display panel, which comprises:

providing an OLED substrate, a cover plate and an encapsulant, wherein the OLED substrate comprising a plurality of OLED substrate units arranged in an array, the encapsulant comprising an encapsulation colloid and two release films adhered respectively to two opposite sides of the encapsulation colloid;

patterning the encapsulation colloid of the encapsulant, wherein specifically, dividing the encapsulation colloid into a plurality of target encapsulation areas, with each target encapsulation area corresponding to each of the plurality of OLED substrate units, and a gap area outside of the target encapsulation areas, performing disintegration treatment on a portion of the encapsulation colloid belonging to the gap area so that the surface of the portion losing adhesiveness;

wherein the manufacturing method for OLED display panel specifically comprising the following steps of:

Step 1: providing an OLED substrate, a cover plate and an encapsulant;

Step 2: removing the release film from one side of the encapsulation colloid;

Step 3: attaching the entirety of the cover plate to the encapsulation colloid at the side with the release film removed;

Step 4: removing the release film from the other side of the encapsulation colloid;

Step 5: patterning the encapsulation colloid of the encapsulant, dividing the encapsulation colloid into a plurality of target encapsulation areas, with each target encapsulation area corresponding to each of the plurality of OLED substrate units, and a gap area outside of the target encapsulation areas, performing disintegration treatment from the other side of the encapsulation colloid on a portion of the encapsulation colloid belonging to the gap area so that the surface of the portion losing adhesiveness;

Step 6: attaching the other side of the encapsulation colloid to the OLED substrate;

Step 7: for each of the plurality of OLED substrate units, cutting the OLED substrate and cover plate bonded to the encapsulation colloid to obtain a plurality of OLED display panels;

wherein in the step of patterning the encapsulation colloid of the encapsulant, a particle beam bombardment process being used to perform disintegration treatment on the surface of the gap area portion of the encapsulation colloid so that the surface of the port losing adhesiveness.

Compared to the known techniques, the present invention provides the following advantages. The manufacturing method for OLED display of the present invention first performs patterning on the encapsulation colloid of the encapsulant to divide the encapsulation colloid into a plurality of target encapsulation areas, with each target encapsulation area corresponding to each of the plurality of OLED substrate units, and a gap area outside of the target encapsulation areas, performing disintegration treatment from the other side of the encapsulation colloid on a portion of the encapsulation colloid belonging to the gap area so that the surface of the portion losing adhesiveness, then attaches the encapsulation colloid to the OLED substrate, and finally, obtains a plurality of OLED display panels by cutting. This method is simple to perform, reduces the size compatibility requirement of the laminator and avoids the use of extra manipulator and carrier fixture, which reduces the product cost incurred by fixture cleaning, transport, storage and other complex operations, and improves the product of the alignment accuracy, is good for automated production.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort. In the drawings.

DETAILED DESCRIPTION OF THE PREFERRED EMBODIMENTS

To further explain the technique means and effect of the present invention, the following uses preferred embodiments and drawings for detailed description.

Figure 1:
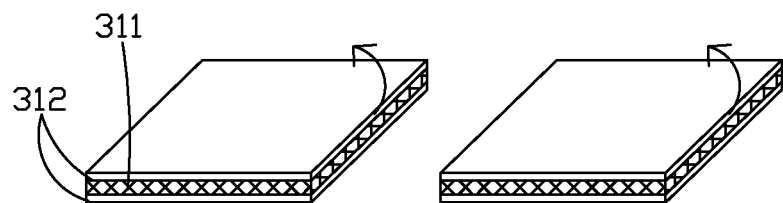
FIG. 1 is a schematic view showing Step 20 of a known manufacturing method for OLED display panel using face seal technology.
Figure 2:
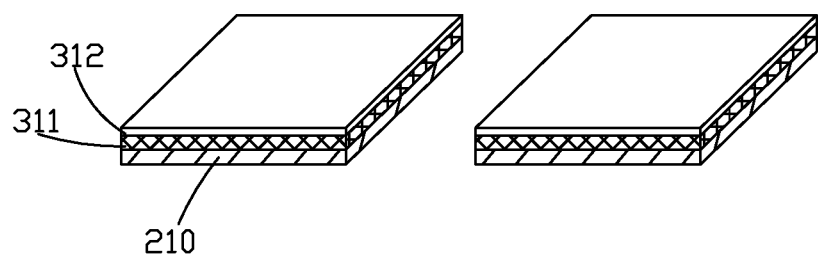
FIG. 2 is a schematic view showing Step 30 of a known manufacturing method for OLED display panel using face seal technology.
Figure 3:
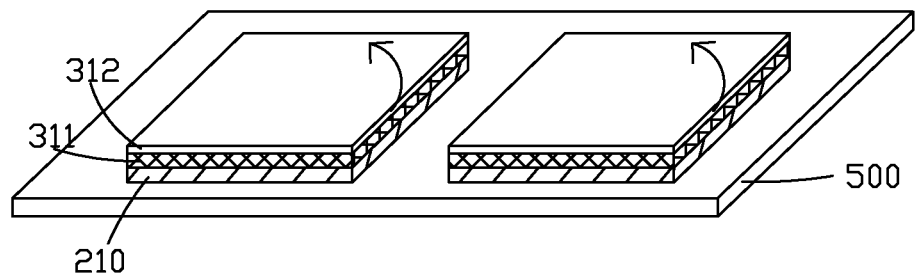
FIG. 3 is a schematic view showing Step 40 of a known manufacturing method for OLED display panel using face seal technology.
Figure 4:
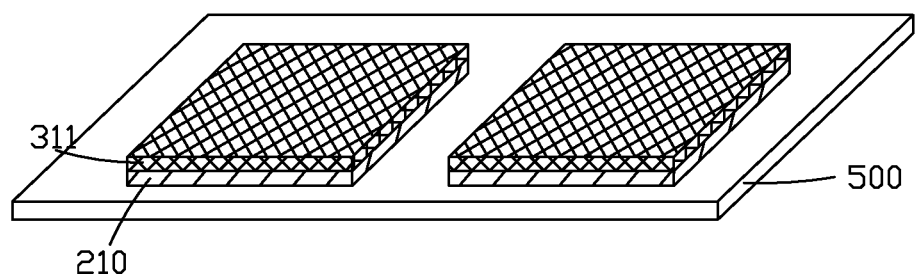
FIG. 4 is a schematic view showing Step 50 of a known manufacturing method for OLED display panel using face seal technology.
Figure 5:
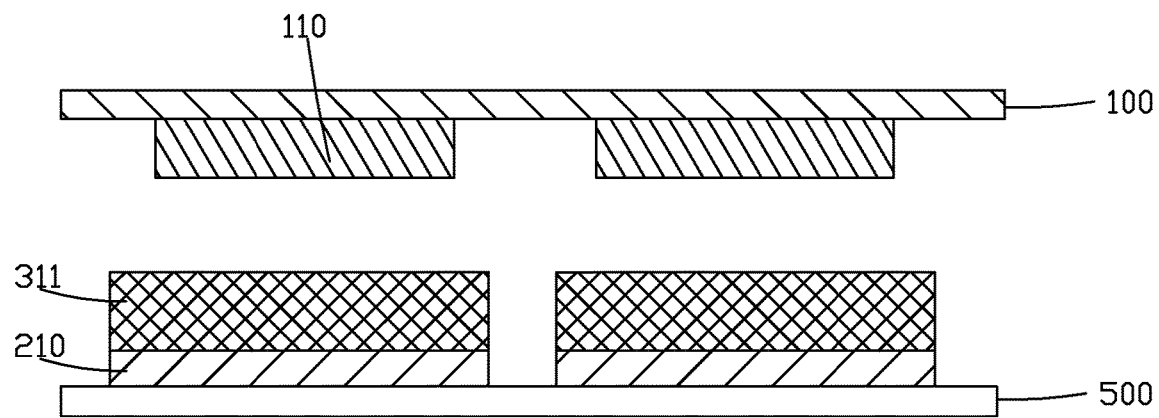
FIG. 5 is a schematic view showing Step 60 of a known manufacturing method for OLED display panel using face seal technology.
Figure 6:
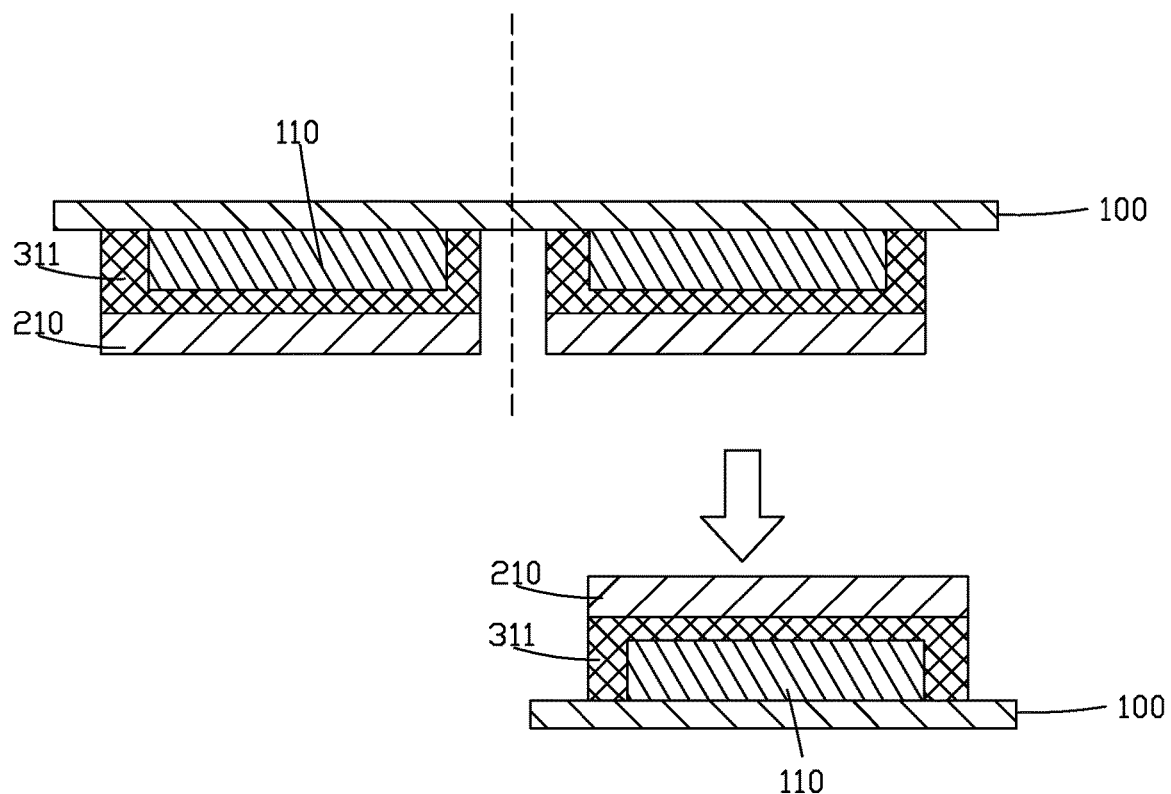
FIG. 6 is a schematic view showing Step 70 of a known manufacturing method for OLED display panel using face seal technology.
Figure 7:
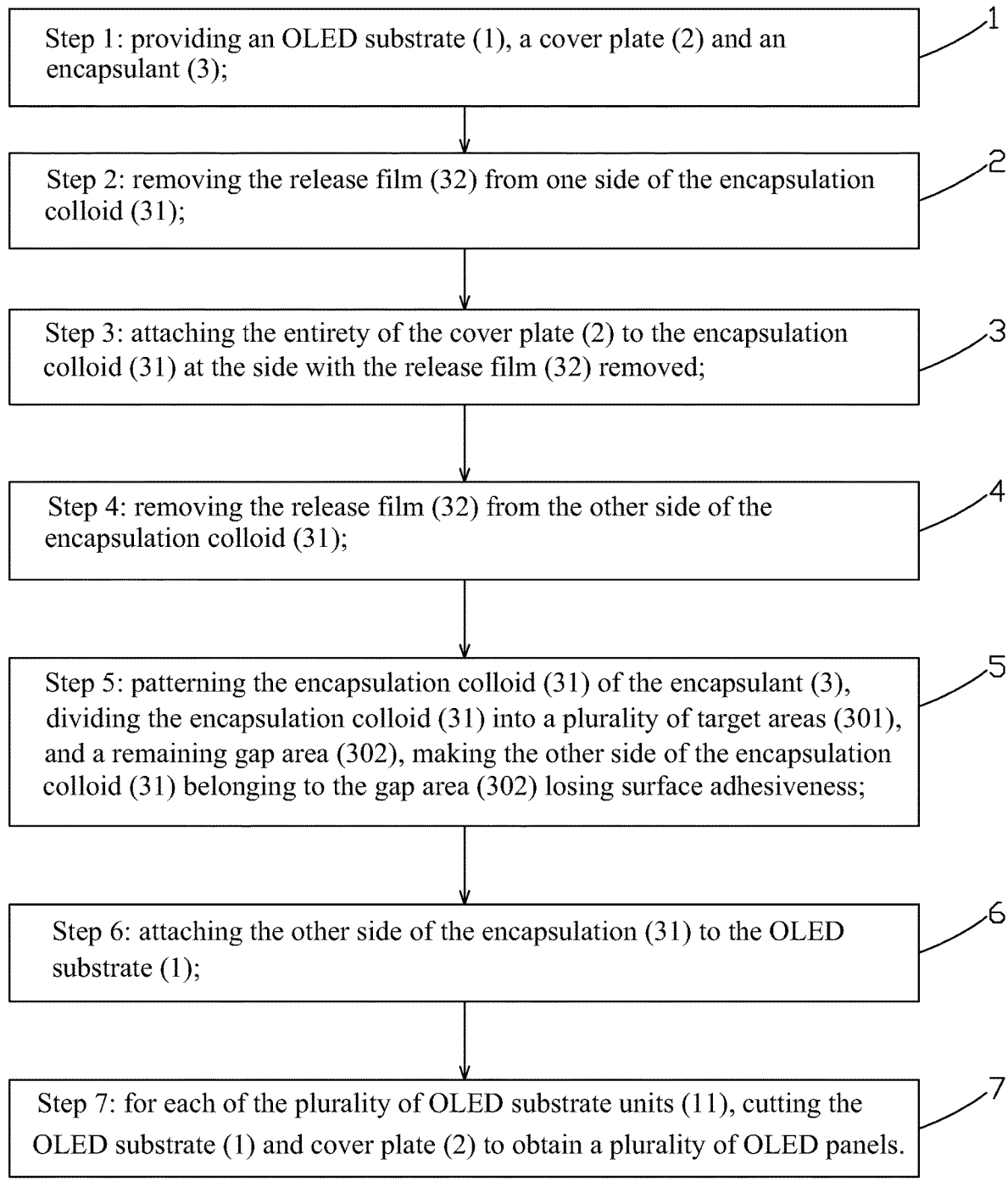
FIG. 7 is a schematic view showing a flowchart of the manufacturing method for OLED display panel provided by the first embodiment of the present invention.

Referring to FIG. 7, the present invention provides a first embodiment of the manufacturing method for OLED display panel, which comprises specifically the following steps of:

Step 1: providing an OLED substrate 1, a cover plate 2 and an encapsulant 3.

Wherein, the OLED substrate 1 comprises a plurality of OLED substrate units 11 arranged in an array, and the encapsulant 3 comprises an encapsulation colloid 31 and two release films 32 adhered respectively to two opposite sides of the encapsulation colloid 31.

Figure 8:
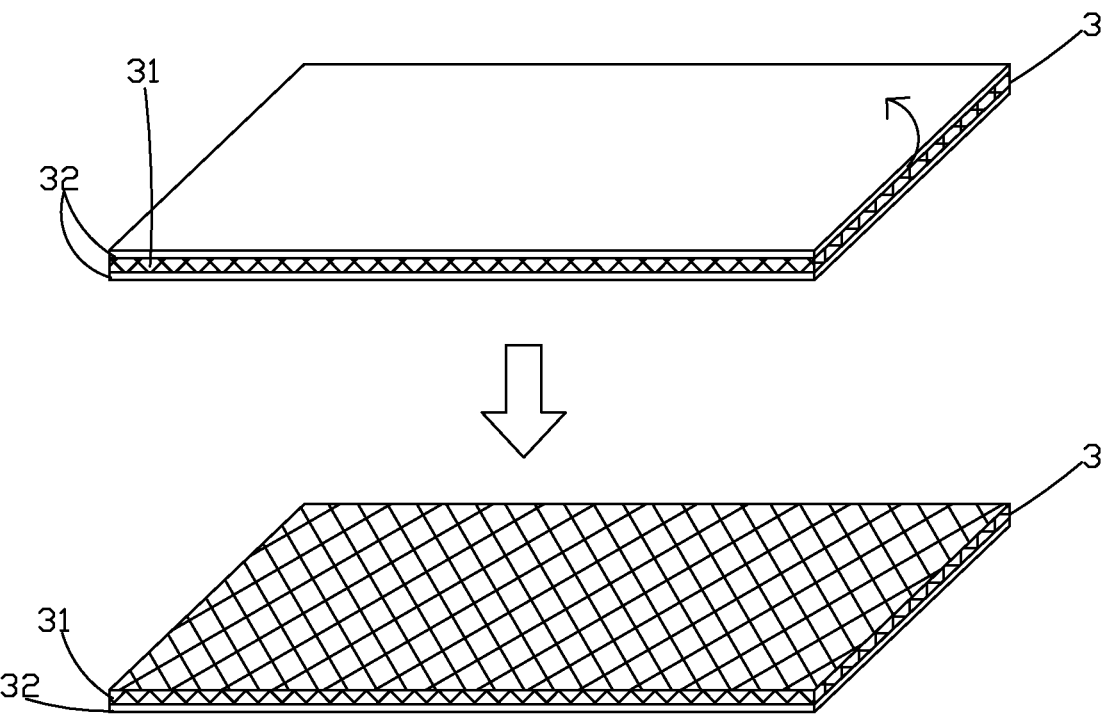
FIG. 8 is a schematic view showing Step 2 of the manufacturing method for OLED display panel provided by the first embodiment of the present invention.

Step 2: as shown in FIG. 8, removing the release film 32 from one side of the encapsulation colloid 31.

Figure 9:
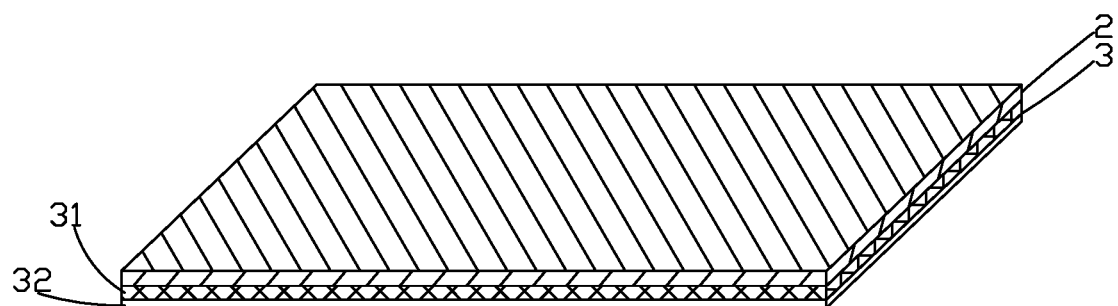
FIG. 9 is a schematic view showing Step 3 of the manufacturing method for OLED display panel provided by the first embodiment of the present invention.

Step 3: as shown in FIG. 9, attaching the entirety of the cover plate 2 to the encapsulation colloid 31 at the side with the release film 32 removed.

Specifically, in Step 3, a laminator is used to perform the attachment of the encapsulation colloid 31 to the cover plate 2.

Specifically, because the in Step 1, the provided cover plate 2 and the encapsulant 3 both correspond to the OLED substrate 1 in entirety, which differs from the known technology wherein the individual OLED substrate unit 11 of the OLED substrate 1 is corresponded to for different sizes of target products, thus the size compatibility requirement for the laminator is reduced.

Figure 10:
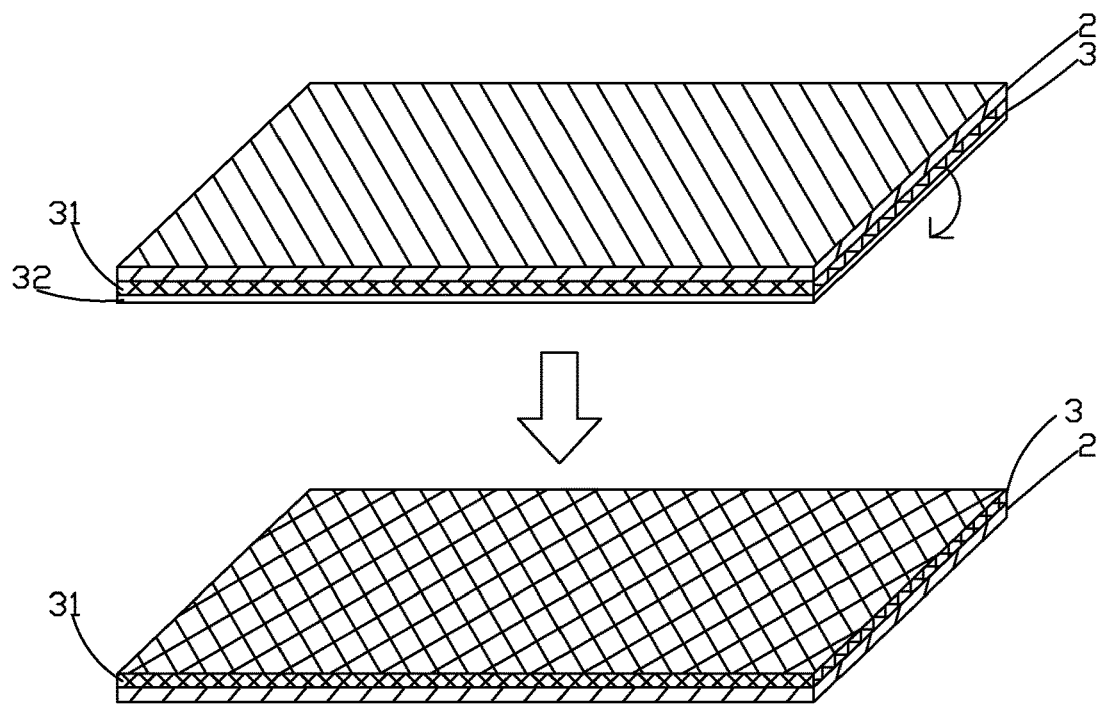
FIG. 10 is a schematic view showing Step 4 of the manufacturing method for OLED display panel provided by the first embodiment of the present invention.

Step 4: as shown in FIG. 10, removing the release film 32 from the other side of the encapsulation colloid 31.

Figure 11:
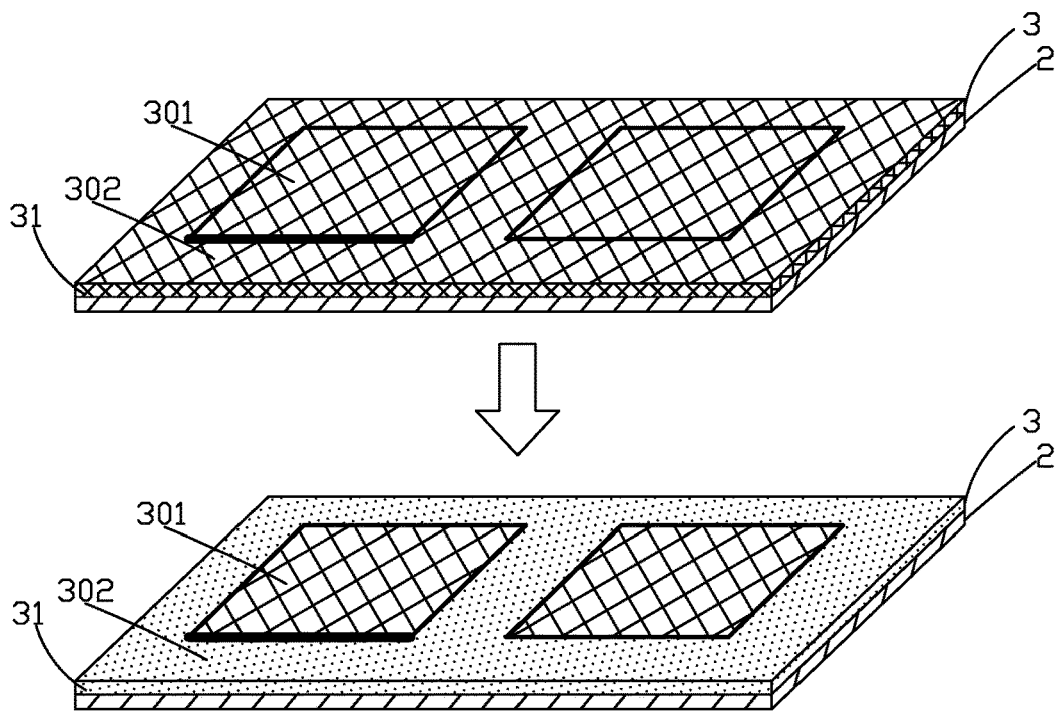
FIG. 11 is a schematic view showing Step 5 of the manufacturing method for OLED display panel provided by the first embodiment of the present invention.

Step 5: as shown in FIG. 11, patterning the encapsulation colloid 31 of the encapsulant 3, dividing the encapsulation colloid 31 into a plurality of target encapsulation areas 301, with each target encapsulation area 301 corresponding to each of the plurality of OLED substrate units 11, and a gap area 302 outside of the target encapsulation areas 301, performing disintegration treatment from the other side of the encapsulation colloid 31 on a portion of the encapsulation colloid belonging to the gap area 32 so that the surface of the portion losing adhesiveness.

Specifically, in the step of patterning the encapsulation colloid 31 of the encapsulant 3, a particle beam bombardment process or a UV irradiation process is used to perform disintegration treatment on the surface of the gap area portion 302 of the encapsulation colloid 31 so that the surface of the portion loses adhesiveness.

Specifically, in the step of patterning the encapsulation colloid 31 of the encapsulant 3, a laser scan process is used to define the target encapsulation areas 301 on the encapsulation colloid 31, so that the encapsulation colloid 31 is cut off between the target encapsulation areas 301 and the gap area 302 to facilitate the subsequent cutting of the cover plate 2.

Figure 12:
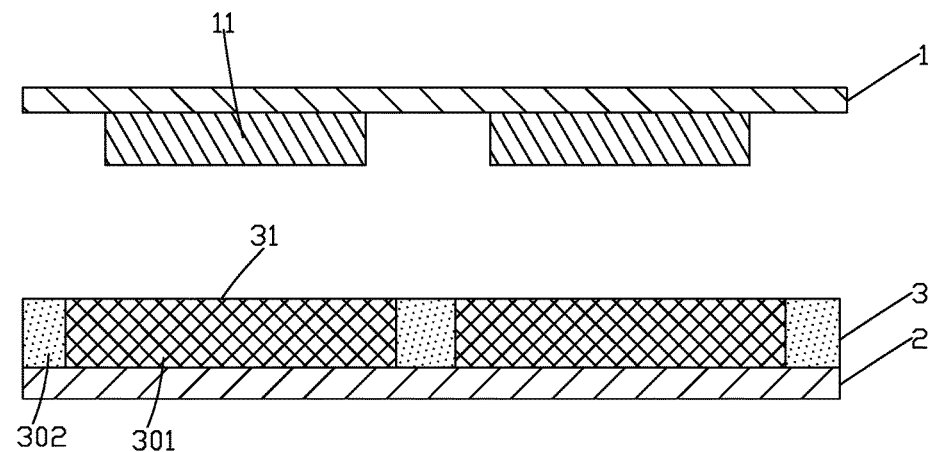
FIG. 12 is a schematic view showing Step 6 of the manufacturing method for OLED display panel provided by the first embodiment of the present invention.

Step 6: as shown in FIG. 12, attaching the other side of the encapsulation colloid 31 to the OLED substrate 1.

Specifically, in Step 6, the attachment of the encapsulation colloid 31 to the OLED substrate 1 is performed in a vacuum environment.

Specifically, each of the target encapsulation areas 301 of the encapsulation colloid 31 is attached correspondingly to each of the plurality of OLED substrate units 11.

Figure 13:
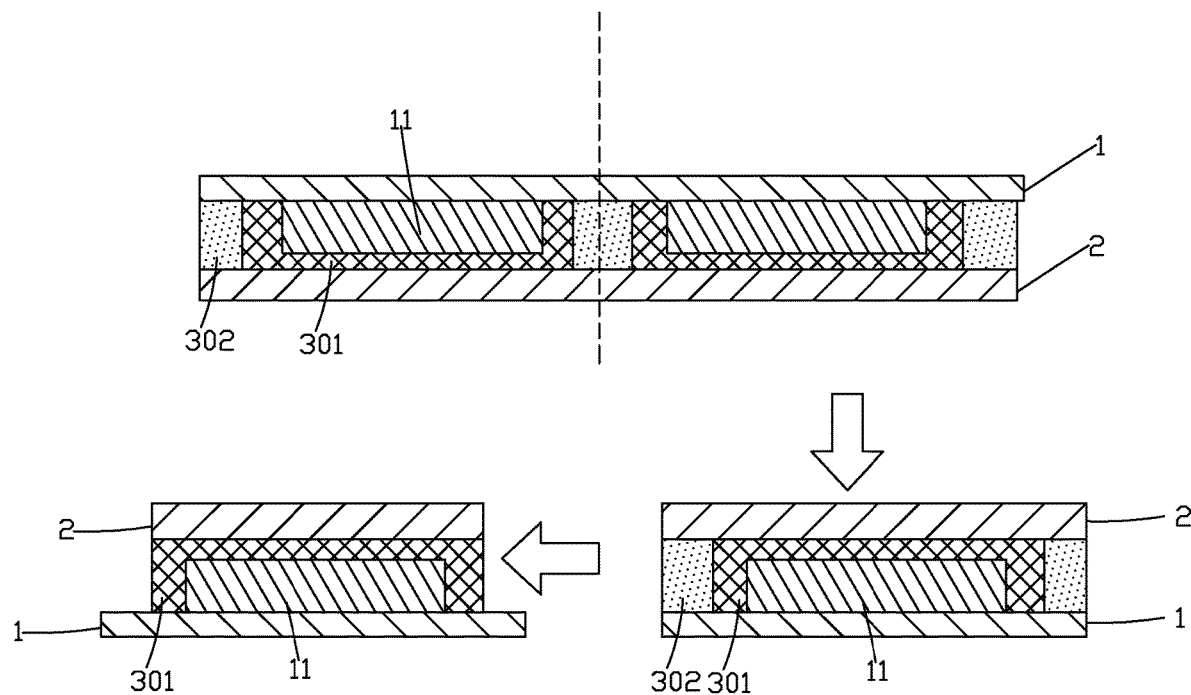
FIG. 13 is a schematic view showing Step 7 of the manufacturing method for OLED display panel provided by the first embodiment of the present invention.

Step 7: as shown in FIG. 13, for each of the plurality of OLED substrate units 11, cutting the OLED substrate 1 and cover plate 2 bonded to the encapsulation colloid 31 to obtain a plurality of OLED display panels.

Specifically, in Step 7, the portion of the encapsulation colloid 31 belonging to the gap area 302 is removed together with a part of the cover plate 2 to be removed during the cutting cover plate 2 process.

Before removing the part of the cover plate 2 to be removed, the portion of the encapsulation colloid 31 belonging to the gap area 302 is peeled.

Figure 14:
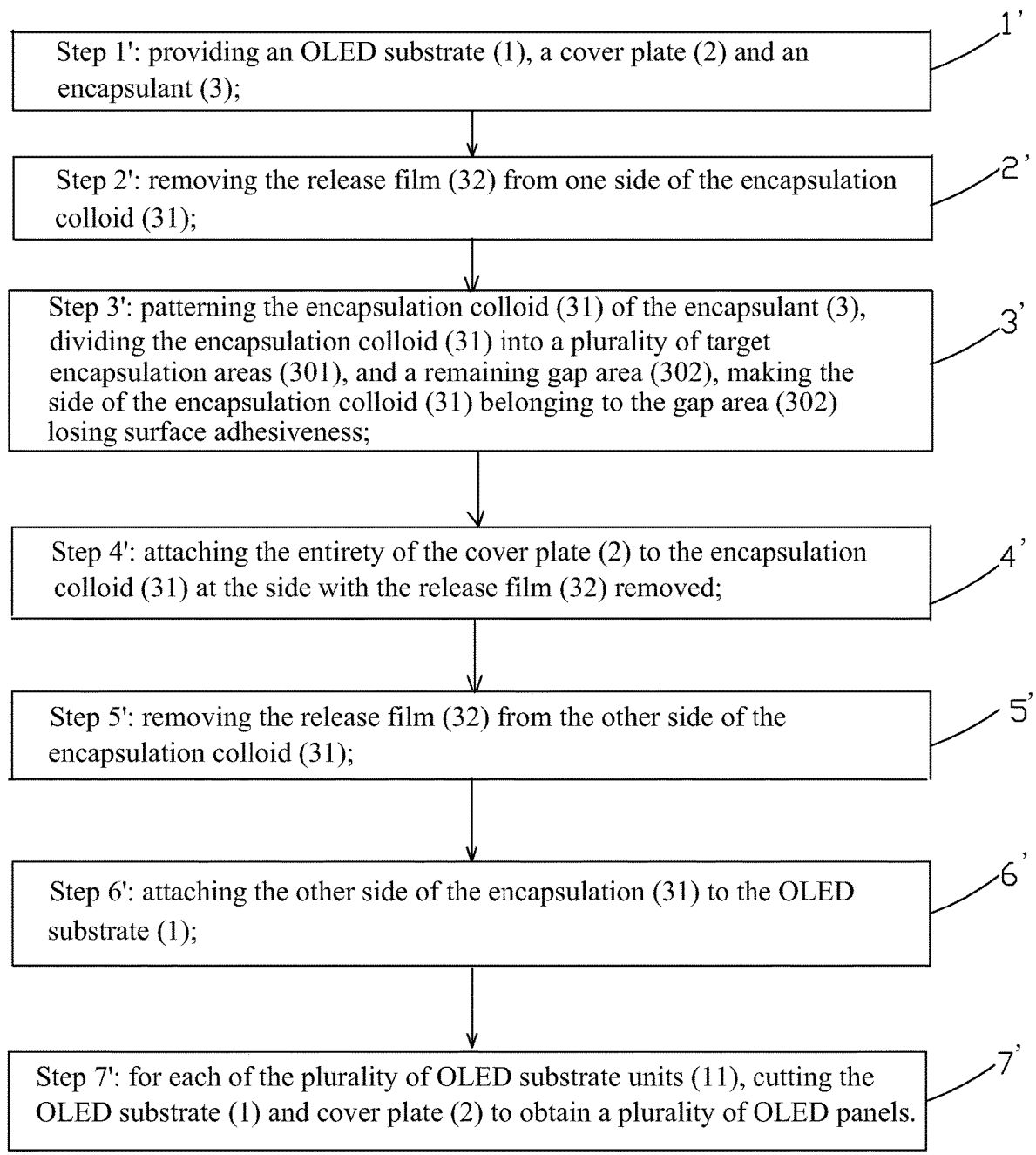
FIG. 14 is a schematic view showing a flowchart of the manufacturing method for OLED display panel provided by the first embodiment of the present invention.

Referring to FIG. 14, the present invention provides a second embodiment of the manufacturing method for OLED display panel. Compared to the first embodiment, the second embodiment performs patterning on the encapsulation colloid 31 before attaching the encapsulation colloid 31 to the cover plate 32. Specifically, the second embodiment comprises the following steps of:

Step 1': providing an OLED substrate 1, a cover plate 2 and an encapsulant 3.

Wherein, the OLED substrate 1 comprises a plurality of OLED substrate units 11 arranged in an array, and the encapsulant 3 comprises an encapsulation colloid 31 and two release films 32 adhered respectively to two opposite sides of the encapsulation colloid 31.

Figure 15:
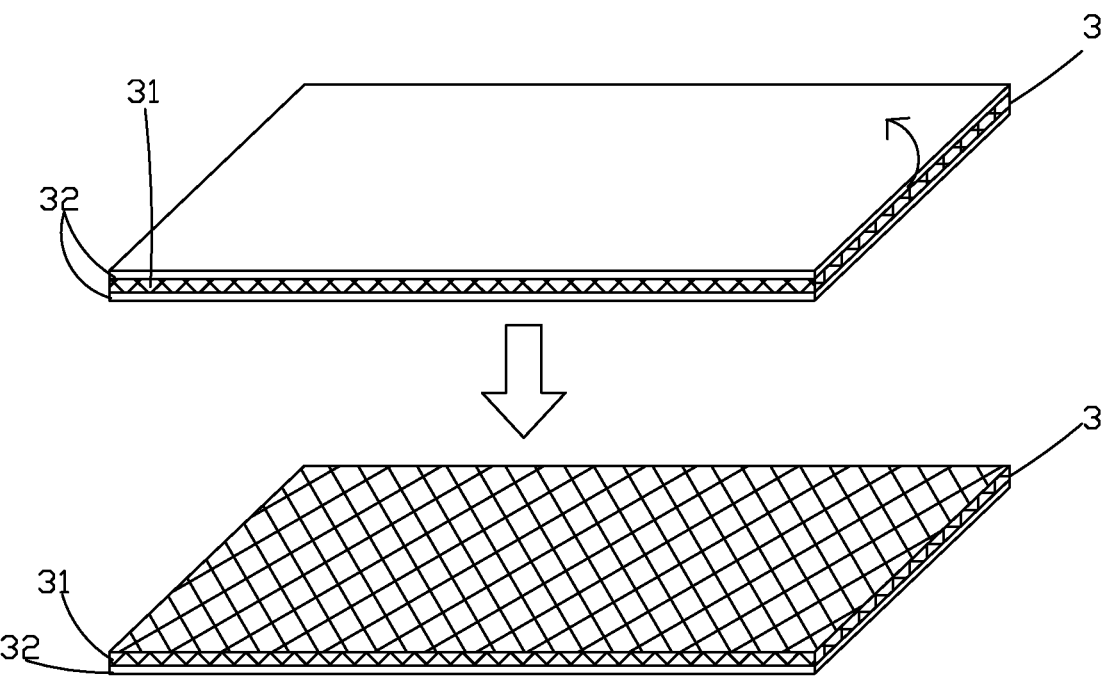
FIG. 15 is a schematic view showing Step 2' of the manufacturing method for OLED display panel provided by the second embodiment of the present invention.

Step 2': as shown in FIG. 15, removing the release film 32 from one side of the encapsulation colloid 31.

Figure 16:
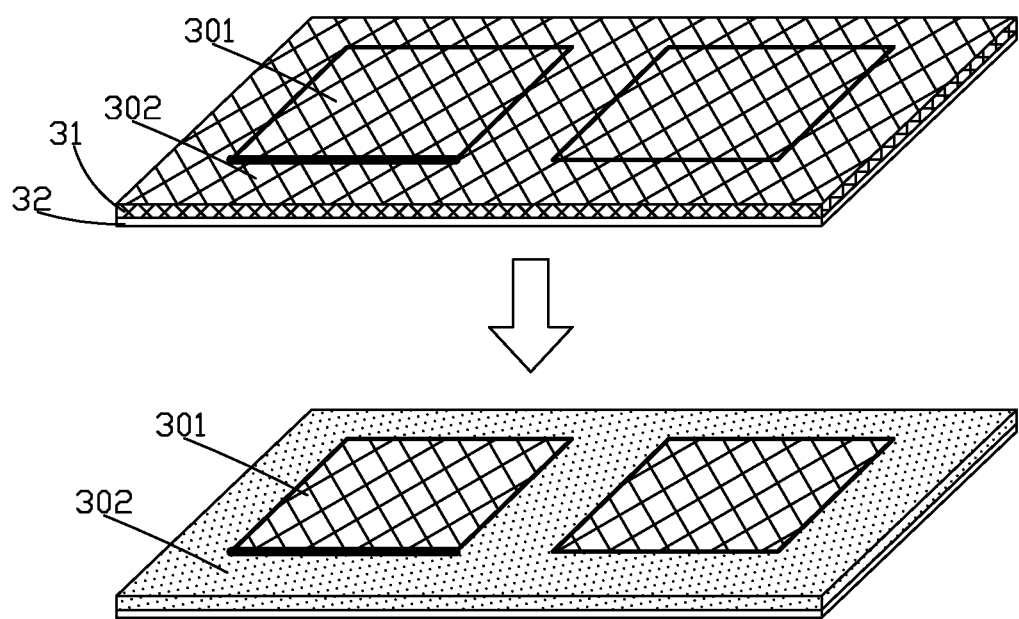
FIG. 16 is a schematic view showing Step 3' of the manufacturing method for OLED display panel provided by the second embodiment of the present invention.

Step 3': as shown in FIG. 16, patterning the encapsulation colloid 31 of the encapsulant 3, dividing the encapsulation colloid 31 into a plurality of target encapsulation areas 301, with each target encapsulation area 301 corresponding to each of the plurality of OLED substrate units 11, and a gap area 302 outside of the target encapsulation areas 301, performing disintegration treatment from the side with the release film 32 removed of the encapsulation colloid 31 on a portion of the encapsulation colloid belonging to the gap area 32 so that the surface of the portion losing adhesiveness.

Specifically, in the step of patterning the encapsulation colloid 31 of the encapsulant 3, a particle beam bombardment process or a UV irradiation process is used to perform disintegration treatment on the surface of the gap area portion 302 of the encapsulation colloid 31 so that the surface of the portion loses adhesiveness.

Specifically, in the step of patterning the encapsulation colloid 31 of the encapsulant 3, a laser scan process is used to define the target encapsulation areas 301 on the encapsulation colloid 31, so that the encapsulation colloid 31 is cut off between the target encapsulation areas 301 and the gap area 302 to facilitate the subsequent cutting of the cover plate 2.

Figure 17:
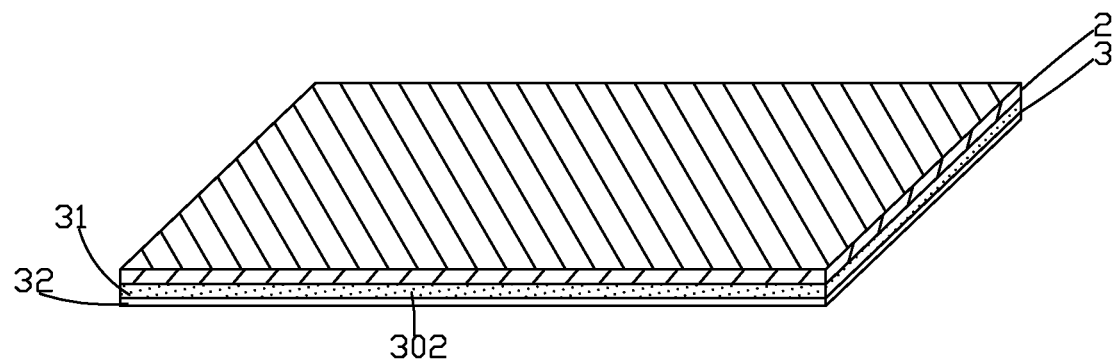
FIG. 17 is a schematic view showing Step 4' of the manufacturing method for OLED display panel provided by the second embodiment of the present invention.

Step 4': as shown in FIG. 17, attaching the entirety of the cover plate 2 to the encapsulation colloid 31 at the side with the release film 32 removed.

Specifically, in Step 4', a laminator is used to perform the attachment of the encapsulation colloid 31 to the cover plate 2.

Figure 18:
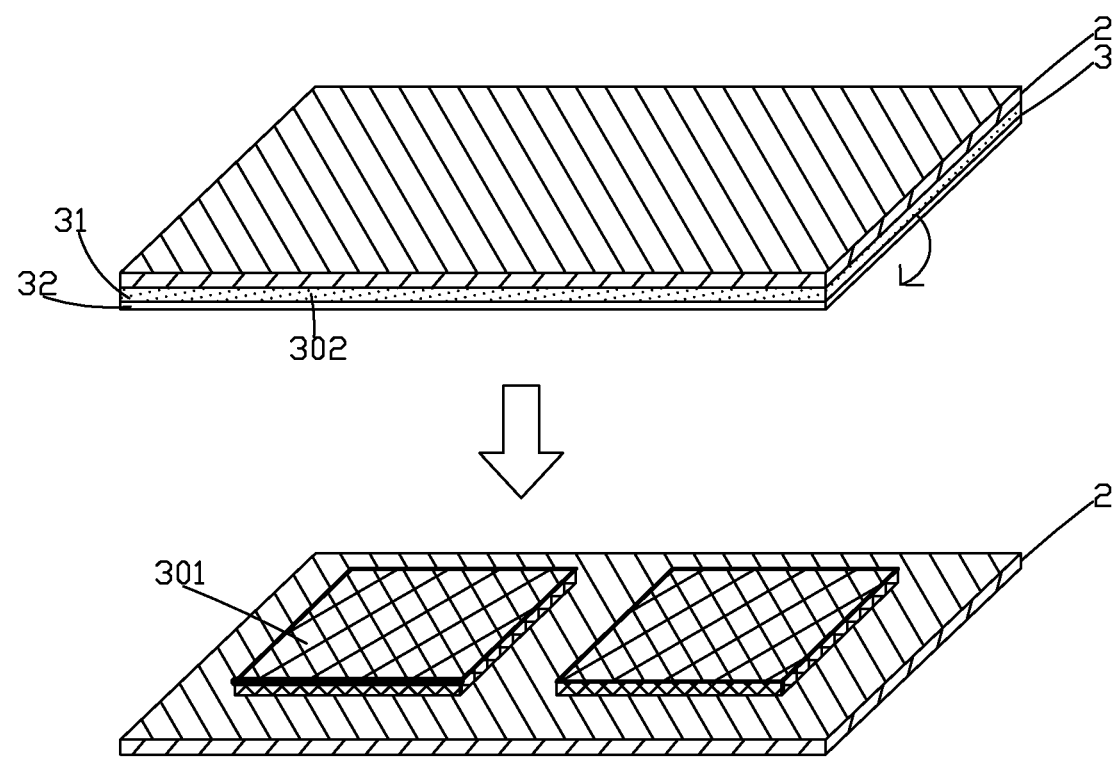
FIG. 18 is a schematic view showing Step 5' of the manufacturing method for OLED display panel provided by the second embodiment of the present invention.

Step 5': as shown in FIG. 18, removing the release film 32 from the other side of the encapsulation colloid 31.

Specifically, in Step 5', the patterning is already performed on the encapsulation colloid 31 of the encapsulant 3, and the surface of the portion on the encapsulation colloid 31 belonging to the gap area 302 has already lost the adhesiveness, therefore, the portion can be removed with the release film 32 in Step 5'. The portion of the encapsulation colloid 31 remained on the cover plate 2 belongs to the target encapsulation areas 301.

Figure 19:
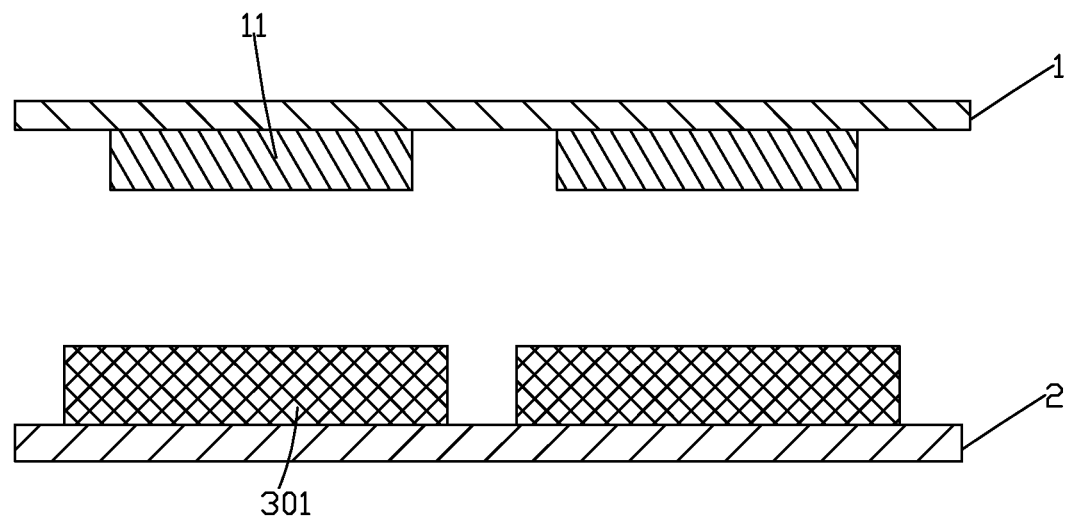
FIG. 19 is a schematic view showing Step 6' of the manufacturing method for OLED display panel provided by the second embodiment of the present invention.

Step 6': as shown in FIG. 19, attaching the other side of the encapsulation colloid 31 to the OLED substrate 1.

Specifically, in Step 6', the attachment of the encapsulation colloid 31 to the OLED substrate 1 is performed in a vacuum environment.

Specifically, each of the target encapsulation areas 301 of the encapsulation colloid 31 is attached correspondingly to each of the plurality of OLED substrate units 11.

Figure 20:
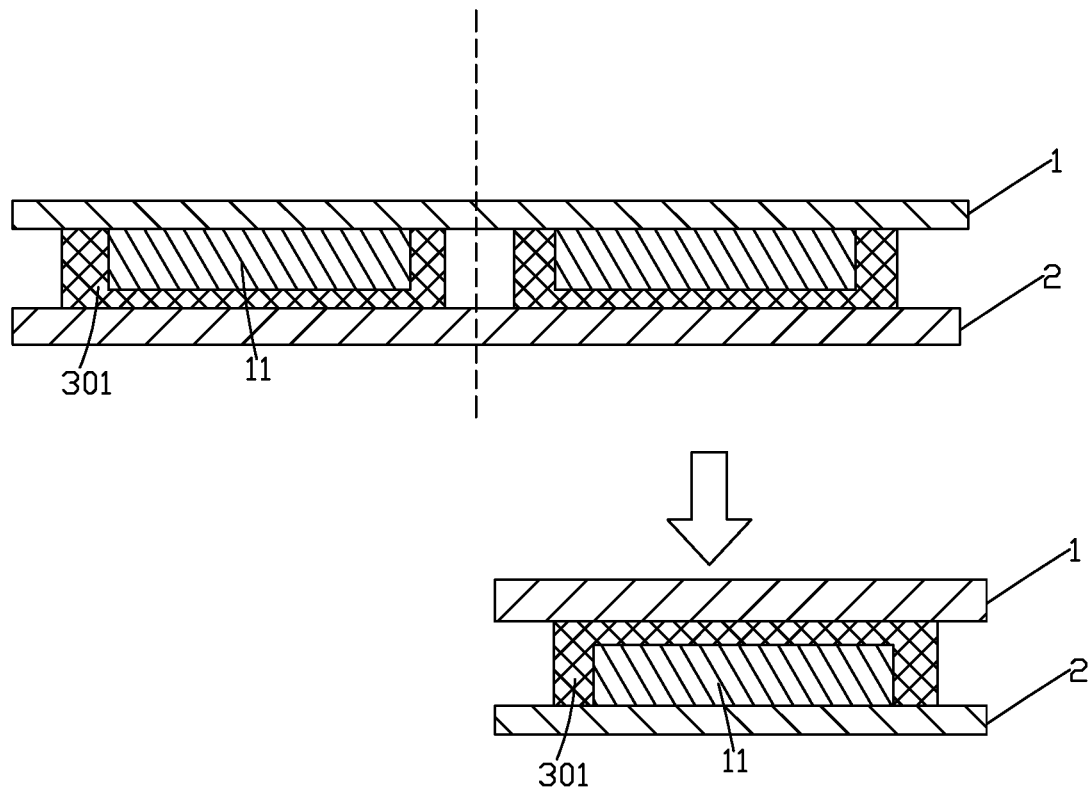
FIG. 20 is a schematic view showing Step 7' of the manufacturing method for OLED display panel provided by the second embodiment of the present invention.

Step 7': as shown in FIG. 20, for each of the plurality of OLED substrate units 11, cutting the OLED substrate 1 and cover plate 2 bonded to the encapsulation colloid 31 to obtain a plurality of OLED display panels.

In summary, the manufacturing method for OLED display of the present invention first performs patterning on the encapsulation colloid of the encapsulant to divide the encapsulation colloid into a plurality of target encapsulation areas, with each target encapsulation area corresponding to each of the plurality of OLED substrate units, and a gap area outside of the target encapsulation areas, performing disintegration treatment from the other side of the encapsulation colloid on a portion of the encapsulation colloid belonging to the gap area so that the surface of the portion losing adhesiveness, then attaches the encapsulation colloid to the OLED substrate, and finally, obtains a plurality of OLED display panels by cutting. This method is simple to perform, reduces the size compatibility requirement of the laminator and avoids the use of extra manipulator and carrier fixture, which reduces the product cost incurred by fixture cleaning, transport, storage and other complex operations, and improves the product of the alignment accuracy, is good for automated production.

It should be noted that in the present disclosure the terms, such as, first, second are only for distinguishing an entity or operation from another entity or operation, and does not imply any specific relation or order between the entities or operations. Also, the terms "comprises", "include", and other similar variations, do not exclude the inclusion of other non-listed elements. Without further restrictions, the expression "comprises a . . . " does not exclude other identical elements from presence besides the listed elements.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the claim of the present invention.

What is claimed is:

1. A manufacturing method for OLED display panel, which comprises:
    providing an OLED substrate, a cover plate and an encapsulant, wherein the OLED substrate comprising a plurality of OLED substrate units arranged in an array, the encapsulant comprising an encapsulation colloid and two release films adhered respectively to two opposite sides of the encapsulation colloid; and
    patterning the encapsulation colloid of the encapsulant, wherein specifically, dividing the encapsulation colloid into a plurality of target encapsulation areas so that each target encapsulation area corresponds to each of the plurality of OLED substrate units, and a gap area outside of the target encapsulation areas, performing disintegration treatment on a portion of the encapsulation colloid belonging to the gap area so that a surface of the portion of the encapsulation colloid belonging to the gap area loses adhesiveness;
    wherein the manufacturing method for OLED display panel specifically comprising the following steps of:
    Step 1: providing an OLED substrate, a cover plate and an encapsulant;
    Step 2: removing the release film from one side of the encapsulation colloid;
    Step 3: attaching the entirety of the cover plate to the encapsulation colloid at the side with the release film removed;
    Step 4: removing the release film from the other side of the encapsulation colloid;
    Step 5: patterning the encapsulation colloid of the encapsulant, dividing the encapsulation colloid into a plurality of target encapsulation areas so that each target encapsulation area corresponds to each of the plurality of OLED substrate units, and a gap area outside of the target encapsulation areas, performing disintegration treatment from the other side of the encapsulation colloid on a portion of the encapsulation colloid belonging to the gap area so that a surface of the portion of the encapsulation colloid belonging to the gap area loses adhesiveness;
    Step 6: attaching the other side of the encapsulation colloid to the OLED substrate;
    Step 7: for each of the plurality of OLED substrate units, cutting the OLED substrate and cover plate bonded to the encapsulation colloid to obtain a plurality of OLED display panels;
    wherein in the step of patterning the encapsulation colloid of the encapsulant, a particle beam bombardment process being used to perform disintegration treatment on a surface of the gap area portion of the encapsulation colloid so that the surface of the gap area portion of the encapsulation colloid loses adhesiveness.

2. The manufacturing method for OLED display panel as claimed in claim 1, wherein a laser scan process is used to define the target encapsulation areas on the encapsulation colloid, and the encapsulation colloid is cut off between the target encapsulation areas and the gap area.

3. The manufacturing method for OLED display panel as claimed in claim 1, wherein in Step 3, a laminator is used to perform the attachment of the encapsulation colloid to the cover plate.

4. The manufacturing method for OLED display panel as claimed in claim 1, wherein in Step 6: the attachment of the encapsulation colloid to the OLED substrate is performed in a vacuum environment.

* * * * *